United States Patent [19]

Kadokura et al.

[11] Patent Number: 4,784,739
[45] Date of Patent: Nov. 15, 1988

[54] METHOD OF PRODUCING A THIN FILM BY SPUTTERING AND AN OPPOSED TARGET TYPE SPUTTERING APPARATUS

[75] Inventors: Sadao Kadokura, Hachioji; Kazuhiko Honjyo, Hino; Akio Kushara, Iwakuni, all of Japan

[73] Assignee: Teijin Limited, Osaka, Japan

[21] Appl. No.: 136,866

[22] Filed: Dec. 22, 1987

[30] Foreign Application Priority Data

Dec. 26, 1986 [JP] Japan .................. 61-308517

[51] Int. Cl.$^4$ .............................................. C23C 15/00
[52] U.S. Cl. ................... 204/192.2; 204/192.12; 204/192.14; 204/298
[58] Field of Search .................. 204/192.12, 192.14, 204/192.2, 298

[56] References Cited

U.S. PATENT DOCUMENTS

| 4,395,323 | 7/1983 | Denton et al. | 204/298 |
| 4,407,894 | 10/1983 | Kadokura et al. | 428/457 |
| 4,576,700 | 3/1986 | Kadokura et al. | 204/192.2 |

FOREIGN PATENT DOCUMENTS

| 59-53680 | 3/1984 | Japan | 204/298 |
| 59-87039 | 5/1984 | Japan | 204/298 |
| 59-116376 | 7/1984 | Japan | 204/298 |
| 59-193528 | 11/1984 | Japan | 204/192.2 |
| 60-46369 | 3/1985 | Japan | 204/298 |
| 60-46370 | 3/1985 | Japan | 204/298 |
| 60-101721 | 6/1985 | Japan | 204/192.2 |
| 60-106966 | 6/1985 | Japan | 204/298 |
| 60-234969 | 11/1985 | Japan | 204/298 |
| 60-234969 | 4/1986 | Japan . | |
| 61-34175 | 6/1986 | Japan . | |
| 61-34176 | 6/1986 | Japan . | |
| 61-183466 | 8/1986 | Japan . | |
| 61-272374 | 12/1986 | Japan | 204/298 |

OTHER PUBLICATIONS

T. A. Amundsen et al., *IBM Tech. Disc. Bull;* vol. 12, p. 1809 (1970).
M. Naoe et al., *J. Crystal Growth,* vol. 45, pp. 361–364 (1978).
S. Kadokura et al., *IEEE Trans. Magnetics,* MAG 17, pp. 3175–3177 (1981).
M. Naoe et al., *J. Appl. Phys.,* vol. 53, pp. 2748–2750 (1982).

*Primary Examiner*—Aaron Weisstuch
*Attorney, Agent, or Firm*—Kenyon & Kenyon

[57] ABSTRACT

A method and apparatus for producing a thin film, such as a magnetic thin film and a metallic thin film on a substrate, such as plastic film, by the employment of a pair of opposed targets spaced apart from one another in a vacuum sputtering gas atmosphere, and magnetic field generating units for generating the perpendicular magnetic field extending perpendicularly to the surface of the targets for confining plasma in the space, and a reflecting electrode arranged adjacent to and in front of the magnetic field generating units and around the periphery of the targets for reflecting electrons toward the space between the opposed targets. The magnetic field generating units are arranged around the outer periphery of each of the opposed targets, and are capable of generating an auxiliary magnetic field for capturing the electrons. The combination of the reflecting of the electrons and the auxiliary magnetic field promotes a uniform erosion of the entire surfaces of the targets and enables a control of the thickness of the deposited film on a substrate having a large width.

29 Claims, 11 Drawing Sheets

METHOD OF PRODUCING A THIN FILM BY SPUTTERING AND AN OPPOSED TARGET TYPE SPUTTERING APPARATUS

BACKGROUND OF THE INVENTION

1. Field of the Invention

The present invention relates generally to a method of and apparatus for producing a thin uniform film or layer, such as a magnetic thin film, a metallic thin film, and a dielectric thin film, on a substrate by sputtering. More particularly, the present invention relates to an opposed target type sputtering apparatus adapted for producing a thin film having a uniform thickness on a substrate, especially a continuously conveyed wide substrate, and suitable for obtaining a magnetic recording medium or a transparent electroconductive member adapted to be used for the manufacture of electric and electronic parts. The opposed target type sputtering apparatus is characterized in that the sputtering surfaces of the opposed targets can be effectively used for producing a thin uniform film on a substrate by sputtering, and that, even if a substrate is wide, the thickness of the film on the wide substrate can be easily controlled.

2. Description of the Related Art

A typical opposed target type sputtering apparatus is disclosed in Japanese Unexamined patent publication No. 57-158380, in which a pair of cathode targets are opposedly arranged in a vacuum vessel, and a magnetic field is generated in the same direction as the opposing direction of the targets. A substrate is arranged at the side of the opposed targets so that a film is produced on the substrate by sputtering. The opposed target type sputtering apparatus is suitable for rapidly producing a film of magnetic material under a low temperature, and thus the apparatus is adopted for the manufacture of a magnetic thin film and a magnetic recording medium.

However, as reported in IEEE Transactions on Magnetics MAG-17, 1981, Pg. 3175, when the above-described opposed target type sputtering apparatus is used for continuously producing a thin film, such as a Co-Cr alloy film of a perpendicular magnetic recording medium, the central part of the sputtering surfaces of the opposed targets is locally and concentrically eroded. Therefore, the efficiency in use of the sputtering surface of the opposed targets is necessarily low. In addition, an uneven thickness of the film occurs in the direction of the width of a substrate on which the film is deposited, and accordingly, the conventional sputtering apparatus is not suitable for a large-scale production of a film by sputtering.

To overcome these problems encountered by the above-described conventional sputtering apparatus, the present inventors proposed a different conventional opposed target type sputtering apparatus in Japanese Unexamined Patent Publications Nos. 58-164781 and 59-116376. The proposed opposed target type sputtering apparatus has a construction such that magnetic core members forming a part of the magnetic field generating unit are arranged around the opposed targets, as will be understood from FIG. 17 illustrating a portion of the proposed opposed target type sputtering apparatus. In FIG. 17, the core members 301 and 302 are arranged around the opposed targets T and T'. The core members 301 and 302 have end portions 301a and 302a inclined and extending toward the surfaces of respective targets T and T' so as to be capable of acting as a magnetic core as well as a shield to prevent electron bombardment. The core members 301 and 302 also have leg portions 301b and 302b around which magnetic field generating sources 301' and 302' consisting of solenoids or permanent magnets are disposed to be magnetically connected to the leg portions 301b and 302b; Thus, a magnetic field H is concentrically generated in the region surrounding the targets T and T'. The sputtering apparatus also has a vacuum vessel 310, target holders 311 and 312, and coolant conduits 311a and 312a. According to the arrangement of the magnetic core members 301 and 302, the magnetic field H is generated directly between the magnetic core members 301 and 302 without passing through the targets T and T'. Therefore, the distribution of the magnetic field is not affected by the magnetic permeability and saturated magnetization of the material of the targets or the thickness of the targets, and thus is always stable. Further, since the magnetic field H for capturing or confining plasma is generated around the targets, the eroded area of the sputtering surfaces of the targets radially extends from the central portion toward the periphery of the sputtering surfaces of the targets. Accordingly, the efficiency in use of the sputtering surfaces of the targets is high. However, when the sputtering takes place, an electric discharge voltage appearing between the opposed targets T and T' is very high, and therefore, the production of the sputtered film cannot be achieved at a high production rate unless a high sputtering gas pressure is formed in the vessel of the apparatus. However, due to the high sputtering gas pressure, the opposed target type sputtering apparatus cannot be permitted to exhibit the typical features thereof, and thus a control of a required crystal structure and a required crystallite texture of the sputtered film cannot be easily achieved. Moreover, when the width of a substrate on which a sputtered film is to be deposited is large, and accordingly, when the width of the respective targets is large, the difference in thickness of the produced film between the central portion and the end portions of the substrate in the direction of the width of the substrate becomes large, and progress of the sputtering erosion of the targets in the central portion thereof is quicker than that in the other portions. As a result, the efficiency in use of the targets is reduced. The present inventors have, therefore, conducted research and experiments to obtain an improved opposed target type sputtering apparatus, and thus have become aware that their research should be directed to the cooperation of the shields (the anodes) of the sputtering apparatus with the perpendicular magnetic field for confining the γ-electrons. According to the present inventors' experiments, it was clarified that the shields of the sputtering apparatus tend to absorb electrons (Y-electrons and thermoelectrons) in the plasma, and that this absorption of the electrons causes the afore-mentioned problem of the opposed target type sputtering apparatus. Therefore, the present inventors contrived to arrange reflecting electrodes, which carry out an operation contrary to that of the above-mentioned shields, in the orbiting region of the electrons controlled by the magnetic field generating unit disposed around the outer periphery of each of the opposed targets, so that the electrons are reflected by the reflecting electrodes. As a result, it was confirmed that the electric discharge characteristic is much improved and that a film having an excellent quality can be produced under a low gas pressure and a low electric voltage. It was also confirmed that, when an auxiliary magnetic field having a field component in parallel with the target surfaces for capturing the electrons is generated along the outer peripheries of the targets and adjacent to the front faces of the targets, the above-mentioned electric discharge characteristic can be further improved, and that the eroded area is extensively increased, i.e., local concentration of the eroded area to the central portion of the targets can be eliminated. As a result, it was confirmed that a uniform erosion of the entire sputtering surfaces of the targets, conventionally considered impossible, can be achieved.

SUMMARY OF THE INVENTION

An object of the present invention is to obviate the defects encountered by the afore-described conventional opposed target type sputtering apparatus, on the basis of the research and experiments conducted by the present inventors.

Another object of the present invention is to provide a method of producing a thin film, such as a magnetic thin film and a metallic film, on a substrate by sputtering, which does not suffer from the above-mentioned problem even when the width of the substrate is large.

A further object of the present invention is to provide an opposed target type sputtering apparatus by which a sputtered thin film can be produced on a substrate at high deposition rate without suffering from the aforementioned problem encountered by the conventional sputtering apparatus.

In accordance with one aspect of the present invention, there is provided a sputtering method of depositing a thin film on a substrate positioned beside a space extending between a pair of opposed cathode targets arranged in a closed vacuum chamber containing a sputtering gas, comprising:

applying electric sputtering power between the pair of opposed cathode targets and an anode electrode;

generating a first magnetic field extending in the direction perpendicular to the surfaces of the pair of opposed cathode targets for capturing plasma;

generating a second magnetic field circulating through the periphery of each of the opposed targets for capturing electrons discharged from the surfaces of the pair of opposed cathode targets, and;

rebounding said electrons discharged from the surfaces of the pair of opposed cathode targets into the space extending between the pair of opposed targets.

In accordance with another aspect of the present invention, there is provided an opposed target type sputtering apparatus for producing a film on a substrate, which comprises:

means for defining a closed vacuum chamber supplied therein with sputtering gas;

a pair of targets arranged to be spaced apart from and opposed to one another within the closed vacuum chamber, each of the targets having a surface thereof;

means for stationarily supporting the pair of targets so as to define a predetermined space between the pair of opposed targets;

means for applying an electric power to the pair of targets for causing sputtering from the surfaces of the targets;

magnetic field generating means arranged around each of the pair of targets for generating a perpendicular magnetic field extending in the direction perpendicular to the surfaces of the opposed targets and coincident with the opposing direction of the pair of targets;

means for holding the substrate at a position beside the space extending between the pair of opposed targets;

reflecting electrode means arranged at at least one of first and second positions for reflecting electrons discharged from the pair of targets during the sputtering, the first position being a position adjacent to and in front of the magnetic field generating means and the second position being a position adjacent to a periphery of each of the pair of opposed targets.

Preferably, the above-defined opposed target type sputtering apparatus for producing a film on a substrate further comprises:

means for generating an auxiliary magnetic field to capture the electrons at a region adjacent to and in front of at least peripheral portions of the opposed targets, the auxiliary magnetic field having a magnetic field component in parallel with surfaces of the opposed targets.

In accordance with the sputtering method and the opposed target type sputtering apparatus of the present invention, (1) it is possible to adjust the extent and the distribution of the eroded area of the sputtering face of each of the opposed targets, so that uniformity in the film thickness in the direction of the width of the substrate can be remarkably increased, (2) it is possible to lower the sputtering voltage, so that a high vacuum sputtering may be easily realized and thus make it possible to enhance the quality of the sputtered film, and (3) it is possible to adjust the heat radiation applied against the substrate so as to be uniform in the direction coincident with the width of the substrate.

Additionally, the arrangement of the magnetic field generating units around the respective targets according to the present invention makes it possible to cool the whole of the respective targets and as a result, cooling effect on each target can be more than 10 times that of the conventional arrangement, in which the magnetic field generating units are arranged behind each of the opposed targets. Accordingly, the speed of deposition of a film by sputtering can be greatly increased.

It was also found that, when a metallic film such as a Ni-Fe alloy film is produced on a plastic film such as a polyester film by the method and apparatus of the present invention, the metallic film can be formed on the plastic film without curling.

It was further found that when a Co-Cr alloy perpendicular magnetic film adapted for a perpendicular magnetic recording medium is produced by the sputtering method and apparatus of the present invention, the film can have a high vertical magnetic coercive force and an excellent magnetic recording characteristic, compared with the film produced by the conventional depositing or sputtering method.

Thus, the present invention is able not only to enhance the quality of a thin film produced on a substrate but also the size (the width and the length) of the substrate on which the film is produced can be increased.

BRIEF DESCRIPTION OF THE DRAWINGS

The above and other objects, features and advantages of the present invention will be made more apparent from the ensuing description of the preferred embodiments of the present invention with reference to the accompanying drawings wherein.

DESCRIPTION OF THE PREFERRED EMBODIMENTS

Figure 1:
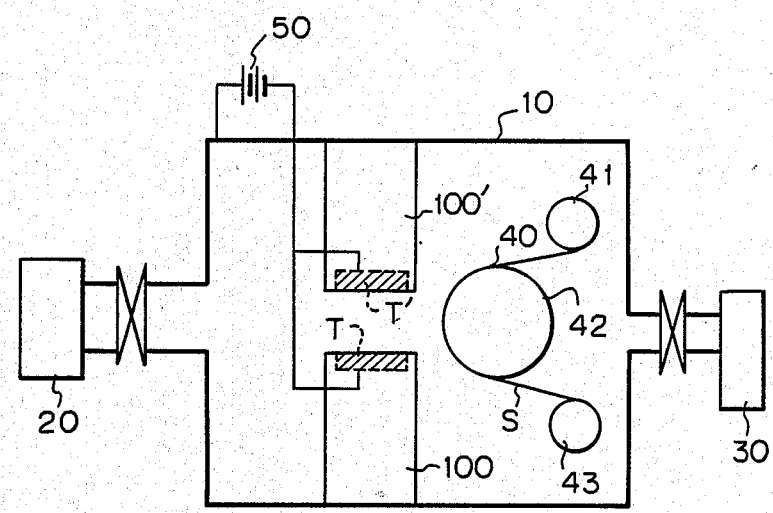
FIG. 1 is a schematic view of the entire construction of an opposed target type sputtering apparatus according to an embodiment of the present invention.
Figure 2:
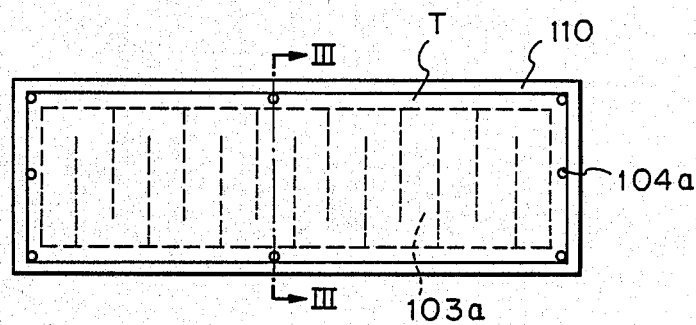
FIG. 2 is a plan view of one of the opposed cathode target portions accommodated in the sputtering apparatus of FIG. 1.
Figure 3:
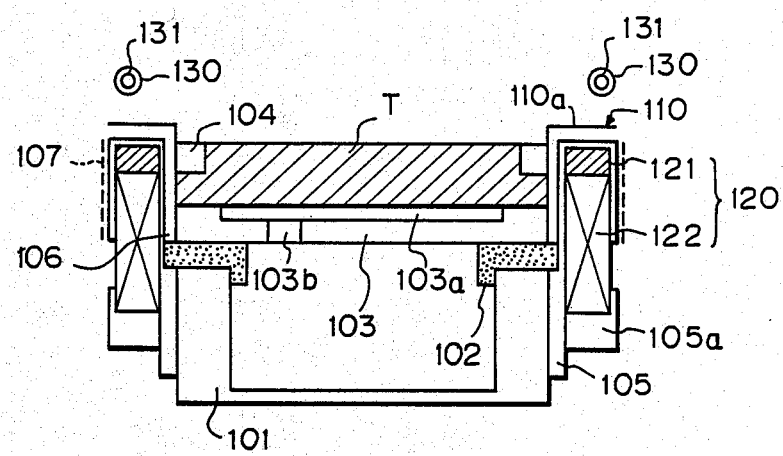
FIG. 3 is a cross-sectional view taken along the line III—III of FIG. 2.

Referring to FIGS. 1 through 3, an opposed target type sputtering apparatus embodying the present invention includes a vacuum vessel 10 for defining therein a confined vacuum chamber, an air exhausting unit 20 having a vacuum pump to cause a vacuum in the confined vacuum chamber, and a gas introducing unit 30 for introducing a preselected sputtering gas into the vacuum chamber so that the pressure of the introduced gas within the vacuum chamber is maintained at a predetermined pressure level of approximately $10^2 \sim 10^4$ Pa. A pair of target portions 100 and 100' are arranged in the vacuum chamber of the vacuum vessel 10 in such a manner that a pair of rectangular shape cathode targets T and T' are opposed to one another while defining a space therebetween, and the long sides thereof face a substrate S held by a substrate holder unit 40. The cathode targets T and T' are electrically connected to a later-described electric sputtering power source 50. The substrate holder unit 40 is rotatably supported by suitable support bracket and includes a supply roll 41 for supplying the substrate S, a support roll 42, and winding roll 43. The substrate holder unit 40 supports and moves the substrate S in such a manner that the substrate S always faces the space extending between the opposed targets T and T', and is arranged to be perpendicular to the sputtering surfaces of the targets T and T'.

Since the construction and operation of the target portions 100 and 100' are the same, a description of the target portion 100 only will be provided hereinbelow.

As illustrated in FIGS. 2 and 3, the target portion 100 includes a magnetic field generating unit 120 for generating both a vertical magnetic field for capturing plasma, and an auxiliary magnetic field is arranged around the target T. Note, the magnetic field generating unit 120 is not arranged behind the target T. The target portion 100 also includes a reflecting electrode 110 having an electric negative potential and arranged directly in front of the magnetic field generating unit 120 so that the electrode 110 can reflect or rebound electrons, such as $\gamma$-electrons. The target T of the target portion 100 is held by a target holder 101 (FIG. 3) in the shape of a parallelepiped having the same rectangular cross-section as the target T, and a bottom. The target holder 101 has a vertical wall having a predetermined thickness. A cooling plate 103 made of electro-conductive material is attached to the top of the target holder 101 by screw bolts, via an insulating block 102 made of insulating material tetrafluoroethylene. As schematically shown by dashed lines in FIG. 2, the entire face of the cooling 103 is formed with zigzag shape cooling recesses 103a to allow a coolant to flow therethrough while cooling the target T. The target T is fixed to the top of the cooling plate 103 by screw bolts 104a inserted through through-holes 104 arranged at the outer periphery of the target T at a predetermined spacing between the neighbouring through-holes 104. The cooling recesses 103a of the cooling plate 103 are connected to a coolant conduit (not shown) via connecting ports 103b, so that the coolant may circulate through the cooling recesses 103a to directly cool the entire area of the target T. Note, portions of the target T, the target holder 101, the insulating block 102, and the cooling plate 103 in contact with each other are appropriately sealed by conventional packing (not shown). The target T can be easily dismounted from the target holder 101 by releasing the screw bolts 104a, and may be replaced with a fresh target T. Also, since the entire area of the target T is always evenly cooled by the coolant, the cooling efficiency of the target T can be more than 10 times as large as that of the conventional cathode target which incorporates a magnet to generate a magnetic field. As a result, the speed of deposition of a film by sputtering can be greatly enhanced so that a large-scale production of the film may be attained. In addition, safety in the operation of the opposed target type sputtering apparatus is increased.

In the present embodiment, the reflecting electrode 110 for reflecting the electrons is formed as a framework member made of copper or iron and having an L-shape cross-section, as best shown in FIG. 3. The framework member is arranged to surround and come into contact with the target T, and is fixed to the cooling plate 103 by screw bolts, so that it is cooled by the cooling plate 103. The framework, i.e., the reflecting electrode 110 in contact with the target T, is maintained at the same electric potential as the target T. A flange portion 110a of the reflecting electrode 110 is positioned so as to extend a few or more millimeters beyond the top sputtering surface of the target T toward the space between the target T and the associated target T' (FIG. 1). This is because, when the target T is a magnetic material target, the flange portion 110a per se is used as a magnetic pole of the later-described magnetic field generating unit 120.

Outside the target holder 101, a channel-like magnet holder 105 made of non-magnetic electro-conductive material, such as stainless steel, is fixedly attached to the target holder 101 by screw bolts. The magnet holder 105 is surrounded by a channel-like holder portion 105a for receiving therein a magnetic core 121 and a permanent magnet 122 of the magnetic field generating unit 120. A predetermined amount of gap 106 is left between the magnet holder 105, and the target T and the cooling plate 103.

The magnetic field generating unit 120 includes the magnetic core 121 made of a plate of a soft magnetic material, such as iron and permalloy, and the permanent magnet 122. As shown in FIG. 3, the magnetic core 121 is located above the permanent magnet 122 when viewed in the opposing direction of the targets T and T', and operates so that an even magnetic field appears around the entire periphery of the target T when the magnetic field is generated from the permanent magnet 122, which has a magnetic pole arrangement by which the magnetic field is generated perpendicular to the sputtering surface of the target T. It should be appreciated that the magnetic core 121 made of a soft magnetic material is fixed to the magnetic holder 105 in such a manner that the front face (the upper face in FIG. 3) of the magnetic core 121 is approximately even with the front sputtering surface of the target T. When the target T is a non-magnetic material target, the even arrangement of the magnetic core 121 enables the generation of an effective auxiliary magnetic field. It should be further appreciated that the permanent magnet 122 is made of a plurality of prism-shape permanent magnet pieces having a predetermined length, respectively, and arranged side by side so that the totally combined magnetic field of the plurality of permanent magnet pieces forms the afore-mentioned magnetic field for capturing the plasma. Therefore, the plasma capturing magnetic field including the afore-mentioned perpendicular magnetic field and the auxiliary magnetic field can be uniformly generated around the periphery of the target T from the magnetic pole formed by either the core 121 or the flange portion 110a of the reflecting electrode 110 (where the reflecting electrode 110 is made of a material capable of forming a magnetic pole).

An anode electrode 130 in the shape of a ring is arranged in front of the reflecting electrode 110, i.e., above the flange portion 110a of the reflecting electrode 110 in FIG. 3, so as to surround the space between the opposed targets T and T'. According to this arrangement of the anode electrode 130, the amount of capturing of γ-electrons during the sputtering operation can be easily controlled. Further, by adjusting the location of the anode electrode 130, it is possible to control the erosion of the target T and the thickness of a sputtered material film on the substrate S. The anode electrode 130 has a conduit 131 therein, for a coolant such as a water.

A metallic net 107 made of stainless steel is arranged around and outside the magnet holder portion 105a of the magnetic holder 105. The metallic net 107 is arranged so that sputter depositions will be attached, and thus these sputter depositions are not separated from the metallic net 107 during a sputtering operation. That is, an occurrence of abnormal electric discharge in the space between the opposed targets T and T' due to separation of the sputter depositions, can be prevented. Further, cleaning of the metallic net 107 for removing the sputter depositions from the net can be easily carried out. Accordingly, not only can the production rate of a film on the substrate S by sputtering be enhanced but also a safe operation of the sputtering apparatus can be ensured.

Since the reflecting electrode 110 is directly attached to the cooling plate 103, and since the anode electrode 130 is cooled by the coolant, i.e., water in the conduit 131, overheating of these electrodes 110 and 130 can be prevented, and as a result, even if the sputtering speed is increased, radiation of heat from these electrodes 110 and 130 against the substrate S is reduced. Therefore, no appreciable deformation of the substrate S occurs. Consequently, a high rate of production of a film by sputtering, as well as the film-deposited substrate used, for example, as a magnetic recording medium, can be realized.

The anode electrode 130 may be made of an electro-conductive material, a soft magnetic electro-conductive material used for making the magnetic core 121, copper, or stainless steel.

The reflecting electrode 110 may be made of either an electro-conductive material or electric insulating material, depending on the use of the reflecting electrode 110 per se. That is, when an electric potential is positively charged from an electric power source to the reflecting electrode 110, the electrode 110 is preferably made of an electro-conductive material. On the other hand, when a direct current sputtering is carried out, and a self bias is utilized for charging the reflecting electrode 110, an appropriate electric insulating material is employed. As will be readily understood from the illustration of FIG. 3 and the description thereof, the reflecting electrode 110 per se is subjected to sputtering during the sputtering operation of the apparatus. Therefore, the electrode 110 should be made of either the same material as the target T or a material containing one or a combination of the components of the material of the target T, so that no foreign component is contained in the film deposited on the substrate S. In the present embodiment of the sputtering apparatus of FIGS. 1 through 3, the electric potential of the reflecting electrode 110 is made equal to that of the target T. However, the reflecting electrode 110 may be connected to an electric power source different from that for the target T, so that the reflecting electrode has an electric negative potential necessary for reflecting the γ-electrons.

Preferably, the electric potential of the reflecting electrode 110 should be maintained at a level at which sputtering does not take place from the reflecting electrode 110.

Figure 5:
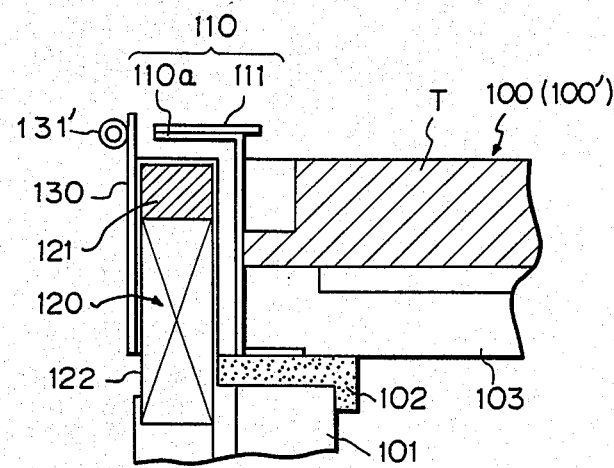
FIG. 5 is a partial cross-sectional view similar to FIG. 4, illustrating a target portion according to another embodiment of the present invention.
Figure 6:
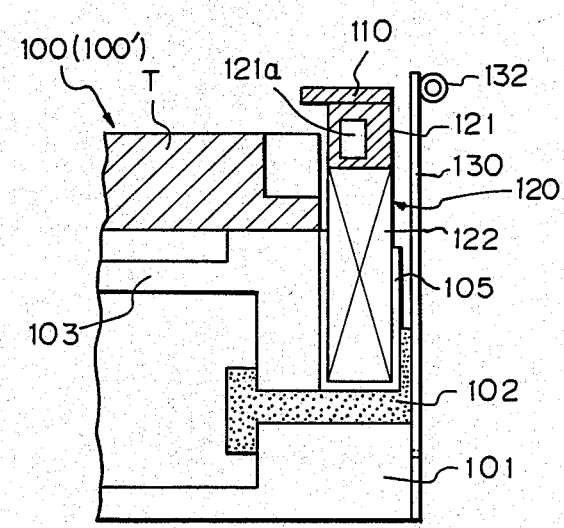
FIG. 6 is a partial cross-sectional view similar to FIG. 4, illustrating a target portion according to a further embodiment of the present invention.

FIGS. 5 and 6 illustrate different embodiments of the construction of the target portions 100 and 100', in which the reflecting electrode 110, the magnetic field generating unit 120, and the anode electrode 130 are constructed such that they are suitable for the large-scale production of a thin film on a substrate by sputtering. It should be understood that the same reference numerals as those in FIGS. 1 through 3 designate the same or like elements.

In the embodiment of FIG. 5, the reflecting electrode 110 has a flange portion 110a provided with a removable reflecting plate 111 fixed to the front face of the flange portion 110a by screws. Thus, the removable reflecting plate 111 for reflecting the electrons may be made of, for example, a material similar to or the same as that of the cathode target T, and may be easily replaced with a different or fresh reflecting plate 111 as required. The reflecting plate 111 may be attached to the flange portion 110a of the reflecting electrode 110 in such a manner that an inner end of the plate 111 is laterally protruded toward the periphery of the target T, as illustrated in FIG. 5. The protruding end of the reflecting plate 111 can be used for controlling the sputtering erosion of the periphery of the target T as well as for preventing an occurrence of sputtering from the screw bolts for fixing the target T to the target holder 101.

The plate-like anode electrode 130 of the present embodiment is constructed so as to be also used as a sputtering shield element, and has at an end thereof, a cooling conduit 131' in which a coolant, such as water, is allowed to flow. The cooling conduit 131' is arranged so as to prevent the anode electrode 130 from being overheated. The arrangement of the plate-like anode electrode 130 and the cooling conduit 131' around the target T contributes not only to an improvement in application of cooling effect to a surrounding area of the target T but also to a reduction in the radiating heat applied to the substrate on which a film by sputtering is deposited. As a result, an increase in the sputtering speed can be expected. Also, deformation of the substrate during sputtering can be prevented.

Referring to FIG. 6 illustrating a further embodiment of the target portion 100, cooling of the reflecting eletrode 110 is improved over that of the previous embodiment of FIG. 5, so that the sputtering speed is further increased. That is, in the present embodiment, the magnet holder 105 receiving therein the magnet 122 of the magnetic field generating unit 120 is in direct contact with the side of the cooling plate 103, and therefore, the magnetic field generating unit 120 can be satisfactorily cooled. In addition, the magnetic core 121 mounted on the permanent magnet 122 has a cooling conduit 121a formed therein, and a plate-like reflecting electrode 110 is fixed to the front face (the upper face of FIG. 6) of the magnetic core 121 by screws. Thus, when a coolant, such as water, flows in the cooling conduit 121a, the magnetic core 121 of the magnetic field generating unit 120 and the plate-like reflecting electrode 110 are cooled, and as a result, an increase in the sputtering speed can be realized. At this stage, when the electric potential of the reflecting electrode 110 should be independent from that of the other portions, e.g., the target T, an electric insulating material is intervened between the magnetic core 121 and the permanent magnet 122. This intervention of the electric insulating material between the magnetic core 121 and the permanent magnet 122 has no adverse affect on the cooling effect and the generation of the magnetic field.

Referring again to FIG. 1 a long strip-like substrate S on which a film is to be deposited, e.g., a magnetic film, is held by the substrate holder unit 40, and is positioned at the side of the opposed targets T and T' of the target portions 100 and 100' so as to face the space extending between these opposed targets T and T', hereinafter referred to as a sputtering space. As previously described, the substrate holder unit 40 includes the supply roll 41, the support roll 42, and the winding roll 43. The support roll 42 is provided therein with an appropriate temperature controller (not shown) for controlling the temperature of the surface thereof, and supports the substrate S in the aforementioned position.

If required, another long strip-like substrate S held by another substrate holder unit (not shown) may be arranged on the other side of the target portions 100 and 100' in the same manner as the unit 40.

The sputtering power supply source 50 consisting of a direct current power source having an electric positive pole which is earthed, and an electrical negative pole connected to the targets T and T', respectively. That is, the sputtering power is supplied between the targets T and T' rendered as electric cathodes and the earth rendered as an electric anode. The direct current sputtering power source is suitable for targets made of an electro-conductive material. However, when the targets T and T' are made of an electrical insulating material, the sputtering power source 50 may be a radio-frequency power source as required.

Figure 17:
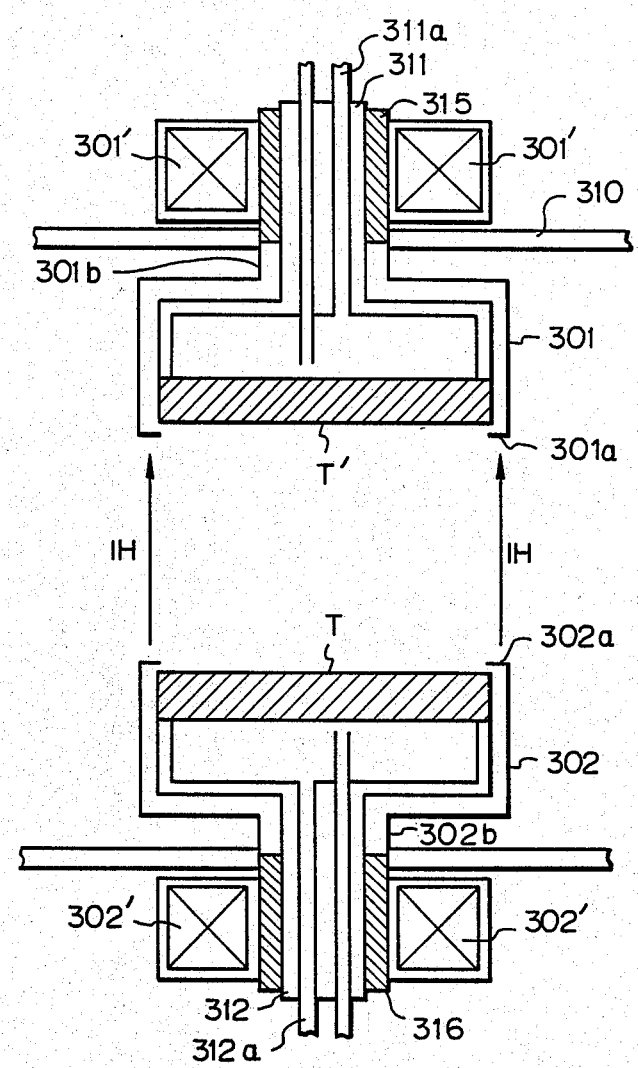
FIG. 17 is a schematic view of the entire construction of an opposed target type sputtering apparatus according to the prior art.

The opposed target type sputtering apparatus according to the above-described embodiments of the present invention is adapted for carrying out a high speed low temperature sputtering. The fundamental sputtering operation of the apparatus is similar to that of the conventional opposed target type sputtering apparatus as shown in FIG. 17. That is, when the sputtering apparatus is brought into operation, a high density plasma is formed in the space between the opposed targets T and T', in which space the sputtering gas ions and the electrons, such as γ-electrons sputtered from the targets T and T' and so on, are confined by the action of the magnetic field for capturing the plasma. Accordingly, the sputtering of the material of the targets T and T' from the surfaces of both targets T and T' is promoted, and as a result, an amount of material expelled from the above-mentioned space is increased, providing an increase in the speed of deposition of the material onto the substrate S. That is, a high speed sputtering is achieved. Also, since the substrate S is positioned beside the targets T and T', a low temperature sputtering is achieved.

At this stage, since the magnetic field generating unit 120 generates the magnetic field mainly in a limited portion of the space extending between the peripheries of the targets T and T', high energy γ-electrons, which are sputtered from the targets T and T' and radiated into the space between the two targets T and T', are distributed at an approximately equal density in the space extending between almost the entire surfaces of the targets T and T' spanning from the center to an area adjacent to the peripheries of the surfaces of the targets T and T'. Also, Ar+ ions, which are used as the sputtering gas ions, are approximately uniformly formed by the entire surfaces of the targets T and T'.

Figure 4:
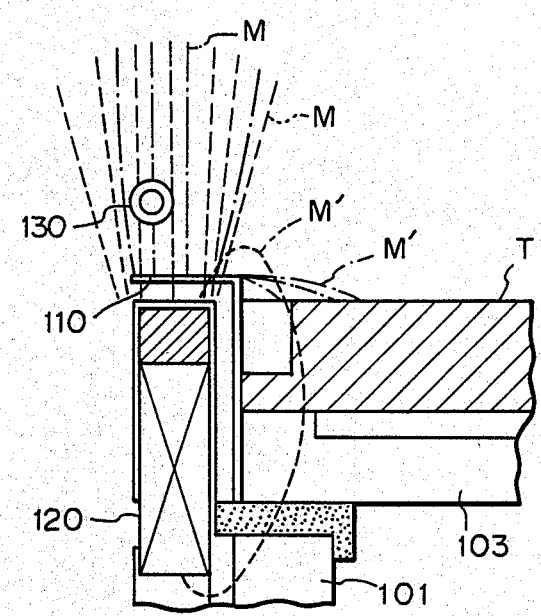
FIG. 4 is a partial enlarged explanatory view of a part of FIG. 3, illustrating the distribution of lines of magnetic force.

On the other hand, in the above-mentioned limited portion of the space extending between the peripheries of the opposed targets T and T', and subject to a strong magnetic field of the magnetic field generating unit 120, there appear principal lines of magnetic force M extending perpendicularly to the surfaces of the targets T and T', and auxiliary lines of magnetic force M' returning through the targets T and T' and having magnetic force components in parallel with the surfaces of the targets T and T' as illustrated in FIG. 4. It should be noted that, in FIG. 4 dashed lines indicate the lines of the magnetic forces M and M' in the case where non-magnetic targets T and T' and non-magnetic reflecting electrodes 110 are employed, and dot-and-dashed lines indicate those in the case where magnetic targets T and T' and magnetic reflecting electrodes 110 are employed. According to the appearance of the principal and auxiliary lines of magnetic forces M and M', the γ-electrons radiating from the central area of the surfaces of the targets T and T', and accelerated in cathode fall regions or in a cathode sheath are restrained by the principal lines of the magnetic force M, and carry out spiral and reciprocatory movements between the opposed targets T and T' along the principal lines of magnetic force M. On the other hand, a part of the γ-electrons radiating from the peripheries of the targets is restrained by the auxiliary lines of magnetic force M', and moves toward the face of the magnetic core 121 of the magnetic field generating unit 120 along the auxiliary lines of magnetic force M'.

However, when an earthed shield element acting as an anode electrode, and conventionally used in the prior art sputtering apparatus as shown in FIG. 17 is either arranged on the magnetic field generating unit 120 or used as a magnetic core of the unit 120, a part of the γ-electrons captured in the peripheral portions of the targets T and T' is absorbed by the shield. Therefore, the plasma density in the space adjacent to the peripheral portions of both targets T and T' must be less than that in the space adjacent to the central portions of the targets T and T'. As a result, the eroded area of each target T or T' is locally concentrated in the central portion of the surface of each target T or T', and accordingly, the film thickness becomes locally thick in the central portion of the substrate on which the film is deposited. In order to overcome these defects, the γ-electrons radiating from the targets T and T' must be reciprocally moved between the opposed targets T and T' without being absorbed between both targets. This reciprocal movement of the Y-electrons may be realized by the method of increasing either the sputtering voltages or the pressure of the sputtering gas. However, such method has a limited effectiveness as described before, and will bring about a problem in the quality of the produced film.

In the opposed target type sputtering apparatus according to the present invention, the electric negative potential reflecting electrodes 110 for reflecting the γ-electrons are arranged in front of the magnetic cores 121 of the magnetic field generating units 120 of both targets T and T'. Therefore, as will be understood from the illustration of FIG. 4, the γ-electrons confined so as to move along the lines of magnetic forces M and M' are reflected from the surface of the reflecting electrodes 110 and returned toward the space between the targets T and T'. Accordingly, the γ-electrons captured by the strong magnetic field in the space adjacent to the peripheries of the opposed targets can be kept in the space extending between the opposed targets. As a result, the electric discharge characteristic is remarkably improved, as described later. Consequently, sputtering under a low electric voltage and a low sputtering gas pressure, that heretofore was considered impossible, can be brought into practice and thus it becomes possible to produce a high quality thin film having neither internal strain nor an appreciable amount of entrapped Argon gas.

Also, as understood from the foregoing description, in accordance with the present invention, the eroded area in the surfaces of the opposed targets T and T' is not localized in only a central portion of respective sputtering surfaces of the targets, but is evenly distributed over approximately the entire sputtering surfaces of the targets T and T', except for the peripheries of these targets. This is explained as follows. That is, according to the lines of magnetic force M', a capturing magnetic field similar to the capturing magnetic field of the magnetron sputtering, and running in parallel with the surfaces of the targets T and T', appears in a portion of the space adjacent to the peripheries of both targets. Thus, the electrons, such as gamma electrons (γ-electrons) reflected from the reflecting electrodes 110 are effectively confined in the space portion adjacent to the peripheries of the targets T and T'. As a result, the plasma density in that space portion is very high, causing sputtering from the peripheries of the targets T and T'. Consequently, the sputtering takes place evenly over the entire surface of each of the target T or T' spanning from the central portion to the periphery thereof, i.e., an even sputtering erosion occurs over the entire surface of each of the opposed targets T and T'. Further, it should be appreciated that, by adjusting the location of the anode electrodes 130, absorption of the gamma electrons can be adjusted as required.

It will now be understood that, according to the present invention, erosion of the sputtering surfaces of the opposed targets T and T' is evenly distributed over the entire target surfaces, and confinement of the gamma electrons can be achieved with an accurate control. Therefore, it it possible to freely control the thickness of a thin film, such as magnetic and metallic films, in the width direction of a substrate S on which the thin film of a material is deposited.

From the foregoing description of the present invention, it will be understood that the reflecting electrodes 130 are able to reflect the electrons confined by the lines of magnetic forces M and M'. Accordingly, the reflecting electrodes should have an electric potential of the same electric polarity as the targets, i.e., a negative potential. However, the level of the electric negative potential of the reflecting electrodes should be experimentally determined depending on the property of each film deposited on the substrate S. When the electric potential of the reflecting electrodes is determined to be the same as that of the targets T', the targets T and T', the electric circuit arrangement for connecting the reflecting electrodes to their power source, as well as the construction of the power source per se, can be advantageously simplified. Namely, when direct current sputtering is carried out, the arrangement of an electric insulating material between the targets and the reflecting electrodes suffices.

The reflecting electrode 110 is preferably arranged in front of the magnetic core 121 of the magnetic field generating unit 120 for effectively reflecting or rebounding the electrons. However, it will be readily understood that the electrode 110 may be arranged at a position adjacent to the core 121 of the magnetic field generating unit 120 and/or adjacent to the periphery of the target T. Preferably, the shape of the reflecting electrode 110 is formed as a rectangular enclosure element as shown in FIG. 2 so that the target T or T' is continuously surrounded by the reflecting electrode 110. Moreover, the reflecting electrode 110 should preferably have the shape of a plate capable of mechanically and entirely covering a gap between the target T or T' and the magnetic field generating unit 120. However, it should be understood that, in some cases, several pieces of plate-shape reflecting electrodes may be arranged at required positions.

Further, the reflecting electrode 110 may be formed by a plurality of rods arranged at certain required positions, or by a mesh-like member.

Although the formation of the afore-mentioned auxiliary magnetic field is not always indispensable for the present invention, it is preferably arranged at least in front of the periphery of each of the targets T and T' to achieve an expansion of the eroded area in the surface of each of the targets. From the view point of simplifying the construction, the unit for generating the afore-mentioned perpendicular magnetic field should be also used as a unit for generating the above-mentioned auxiliary magnetic field. Naturally, both units may be separately and individually arranged as required.

In the illustrated and described embodiments, the magnetic field generating unit 120 includes the permanent magnet 122, from the view point of simplifying the construction of the target portion 100 or 100'. However, the permanent magnet 122 per se may be replaced by other magnet means, such as a conventional solenoid or electromagnet means as shown in the prior art construction of the sputtering apparatus of FIG. 17.

The anode electrode 130 may be arranged at any one of the positions suitable for appropriately absorbing the electrons, and thus may be arranged at a position adjacent to each of the reflecting electrodes 110. Also, an embodiment wherein a single anode electrode is arranged at an intermediate position between the opposed targets T and T' may be employed.

The shape of the anode electrode is not limited to the rectangularly shaped tubular electrode as employed in the described embodiment. For example, a mesh-like element surrounding each of the targets T and T' may be used. Moreover, the anode electrode may be arranged so as to either surround each of the targets or be positioned at a required position. From the view point of acquiring an even erosion of the surface of each target, the anode electrode should be arranged so as to entirely surround the sides of each of the targets T and T', and enclose the space between the opposed targets T and T'. Since the location of the anode electrode is closely related to the thickness of a film produced on a substrate, this should be experimentally determined depending on the required conditions, such as the sort of film material, use of the produced film, and so on.

Further, it is obvious from the gist of the present invention that the shape of the targets T and T' is not limited to a circle, square, or a rectangle. It should be understood that the present invention can be advantageously used in the case of the employment of the rectangular-shape target having a large width, even though such a target involves difficulty in the control of the film thickness and the problem of an even erosion of the target.

The description of the invention will now be provided hereunder by of non-limitative Examples of film production by the employment of the opposed target type sputtering apparatus according to the embodiments of the present invention.

EXAMPLE 1

In this Example 1, a target portion 100 (100') constructed so as to conform with that illustrated in FIG. 3 was employed. The targets T and T' are respectively made of an iron plate in the shape of a rectangle 125 mm in length, 575 mm in width, and 20 mm thick. The targets T and T' are 120 mm spaced apart from one another. The reflecting electrode 110 for each target T or T' made of iron was employed and positioned so as to be projected 2 mm from the surface of each target T or T' toward the space between the targets T and T'. The electric potential of the reflecting electrode was set so as to be equal to that of each target. An Alnico 7 magnet was employed for the magnetic field generating unit 120 for each of the target portions 100 and 100', and a magnetic field of 330 gauss was generated on the surfaces of respective reflecting electrodes in the direction perpendicular to the surfaces of respective targets T and T'. A rod-like tubular anode 130 was arranged in the space between the targets at a position 10 mm apart from the face of the reflecting electrode 110, with respect to each of the targets T and T'.

Figure 7:
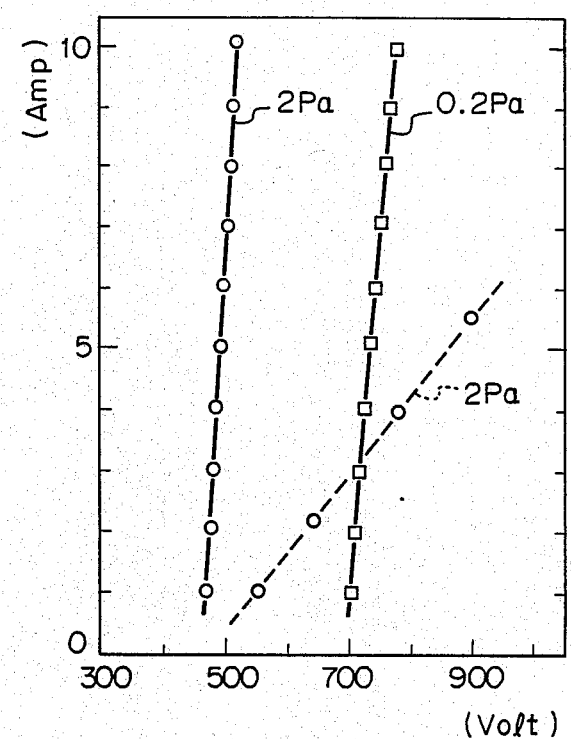
FIG. 7 is a graph indicating the relationship between the voltage and current, which illustrates the sputtering characteristic in the case of example 1 of a film production.

The graph of FIG. 7 indicates examples of the sputtering characteristic. That is, the characteristic of the voltage versus current was between 450 through 700 volts under an argon gas pressure (sputtering gas pressure) of 2 Pa through 0.2 Pa, and this was excellent. In FIG. 7, the dashed line indicates the case where the reflecting electrodes 110 were electrically insulated from the targets T and T' and were earthed so that the electrodes 110 were not used for reflecting the gamma electrons but were used as conventional earthed shields working as anodes. Thus, in the conventional case, it was understood that the sputtering voltage becomes high even under a 2 Pa argon pressure.

Figure 8:
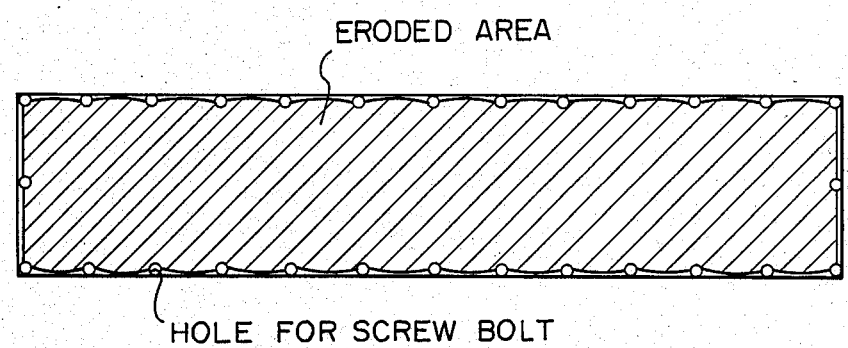
FIG. 8 is an explanatory view of erosion in the target in the case of example 1.

FIG. 8 illustrates the eroded area (the hatched area) in the surface of each of the targets T and T'. It is understood from the illustration of FIG. 8 that, since the sputtering has evenly taken place over approximately the entire surface of each target, including a portion adjacent to the holes for the screw bolts, the entire surface of the target T (T') was eroded to a uniform depth. The ratio of the eroded area to the entire surface of each target was more than 99%.

Figure 9:
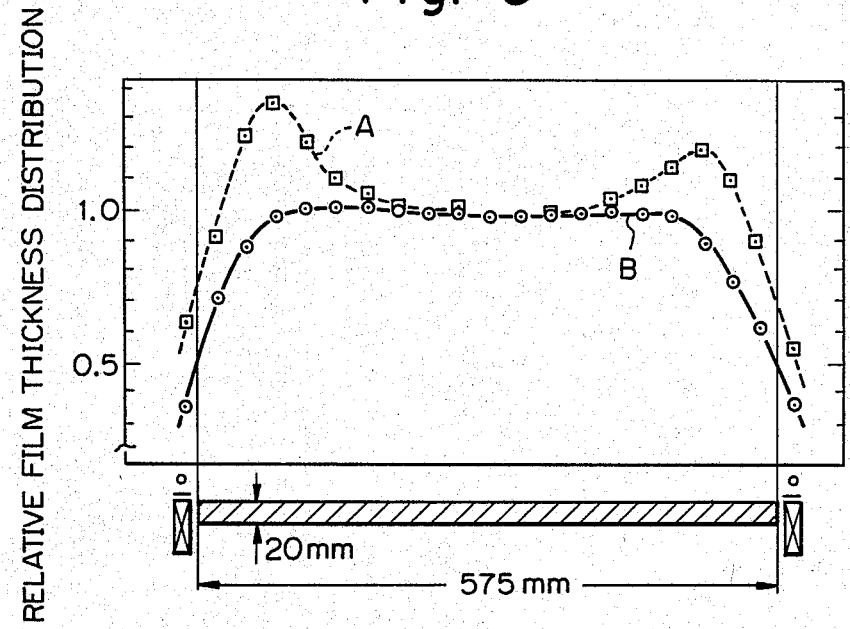
FIG. 9 is a graphical view of the film thickness in the direction of the width of a substrate on which a thin film is produced by sputtering, with respect to example 1.

FIG. 9 illustrates the characteristic of the film thickness in the direction of the width of the substrate S when the substrate was located 30 mm to one side of the ends of both opposed targets. The curves A and B indicate the two different film thickness characteristics obtained by adjusting the location of the anode electrodes 130. The curve A indicates the case where the anode electrodes 130 were arranged above and along the outer periphery of each of the reflecting electrodes 110, and curve B indicates the case where, with respect to the sides facing the 125 mm length portion of the targets T and T', the anode electrodes 130 were located 10 mm closer together, compared with those of case A. The location of the anode electrodes 130 with respect to the other sides was similar to that of case A.

EXAMPLE 2

The material of the targets T and T' used for producing a thin film of Example 2 was similar to that of the targets of Example 1, i.e., iron. The size of both targets was 125 mm in length, 125 mm in width, and 20 mm thick. The other operating conditions of the opposed target type sputtering apparatus for Example 2 were the same as that of Example 1, and the sputtering characteristic was examined.

Figure 10:
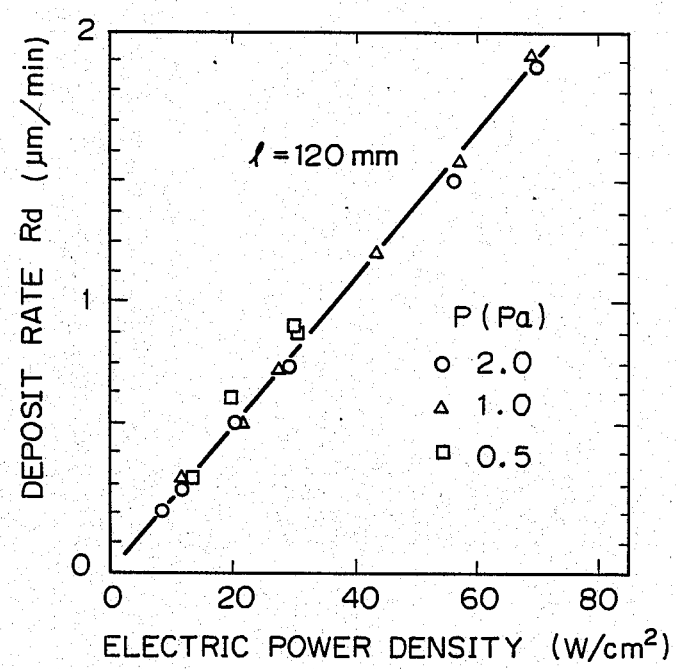
FIG. 10 is a graph indicating the relationship between the density of the applied electric power Pi and the speed of deposition Rd of a film, with respect to example 2.

The graph of FIG. 10 indicates the examined sputtering characteristic. In FIG. 10, the abscissa indicates the density of the electric power $P_i$ (W/cm$^2$) supplied to the apparatus, and the ordinate indicates the rate of deposition of the film $R_d$ (micrometers/min) at a position of the substrate 30 mm distant from the end thereof and facing the center of the space between the opposed targets T and T', i.e., 60 mm from each of the targets. It is understood from FIG. 10 that, when the density of the electric power was gradually increased to 70 W/cm$^2$, the deposition rate Rd was approximately, proportionally increased to 1.9 micrometers/minute. Further, it was confirmed that, when the pressure of the argon gas (Ar) was varied to 0.5 Pa, 1.0 Pa, and 2.0 Pa, the relationship between the deposition rate Rd of the film and the supplied electric power Pi was unchanged and was substantially equal, as shown in FIG. 10.

From the results of the examination, it can be understood that, according to the present invention, since the cooling effect of the targets is enhanced, and since the sputtering voltage can be lowered (500 through 900 volts), the opposed target type sputtering apparatus can appreciably increase the production of a film, and can remain stable as it is not adversely affected by changes in the sputtering gas pressure.

EXAMPLE 3

In Example 3, the experimental film production was carried out by the opposed target type sputtering apparatus having the target portions 100 and 100' as shown in FIG. 3, which was used for the film production of Example 1, for examining the electron reflecting effect achieved by the reflecting electrodes 130 as well as the plasma capturing effect of the auxiliary magnetic field generated in the region adjacent to the periphery of each of the targets and having a magnetic field component in parallel with the surface of each target. The locations of the reflecting electrodes 110 and the magnetic field generating units 120 were varied from the basic locations as shown in FIG. 3 to those described hereinbelow. The material of the targets T and T' was Co-Cr 17 weight % alloy, which is a known typical material for producing the perpendicular magnetic recording layer of the perpendicular magnetic recording medium, and thus the film of Co-Cr alloy was deposited on the substrate S.

Figure 11A:
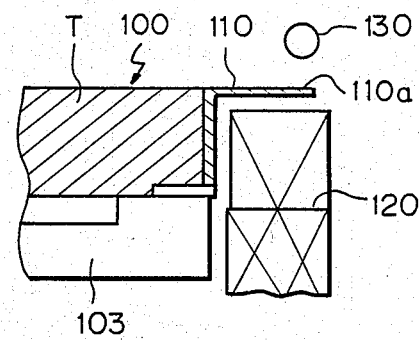
FIGS. 11(A) through (C) are explanatory views of the locations of the reflecting electrode and the magnetic field generating means, with respect to example 3.
Figure 11B:
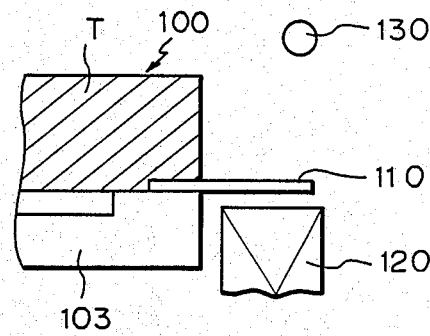
Figure 11C:
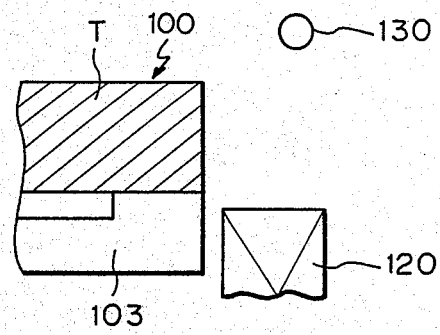

FIGS. 11A through 11C illustrate the constructions of the target portion 100 or 100' employed for the examination of Example 3.

Compared with the basic construction (referred to as type A) of FIG. 3 (or FIG. 4), FIG. 11A illustrates the case (referred to as type B) where the reflecting electrode 110 made of cobalt and functioning as a magnetic pole was arranged so that the opposing face 110a (the top face of FIG. 11A) of the flange-like portion of the reflecting electrode 110 is approximately even with the surface of the target T, and therefore, an auxiliary magnetic field was not generated.

FIG. 11B illustrates the case (type C) where the reflecting electrode 110 made of copper was arranged in front of the magnetic field generating unit 120 and around the periphery of the target T. The reflecting electrode 110 was also arranged so that it was located behind the surface of the target T.

FIG. 11C illustrates the case (type D) corresponding to the above-mentioned case of FIG. 11B except that the reflection electrode 110 was eliminated. Thus, an auxiliary magnetic field was not generated.

Figure 12:
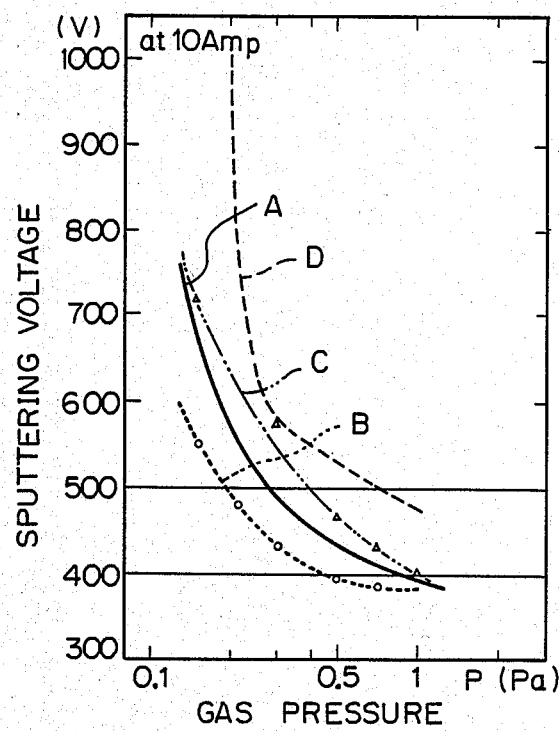
FIG. 12 is a graph indicating the electric discharge characteristic with respect to each of the cases of example 3.

With the above-mentioned types A through D, the film production was carried out under a constant sputtering current I, i.e., I was maintained at 10 Amperes. When the pressure of the argon gas was set at various values in the range of 0.1 Pa through 1.0 Pa, the relationships between the argon gas pressure Pa and the electric sputtering voltage were as illustrated in the graph of FIG. 12, in which the abscissa indicates the argon gas pressure (Pa), and the ordinate indicates the electric sputtering voltage (Volts).

Figure 13:
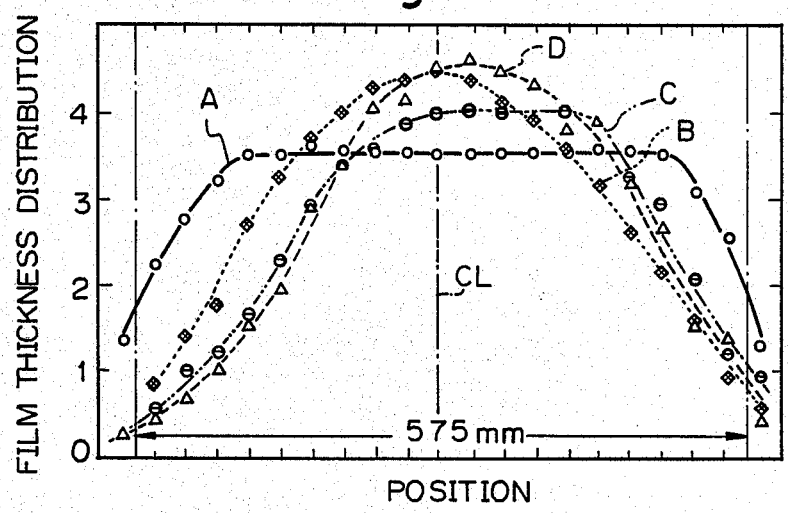
FIG. 13 is a graph indicating the film thickness in the direction of the width of a substrate, with respect to each of the cases of example 3.

Also, the thickness of the perpendicular Co-Cr film produced in Example 3 in the direction coincident with the long side (575 mm width) of the targets T and T' was illustrated in FIG. 13, in which the abscissa indicates the position of the substrate in the direction of the width thereof and the ordinate indicates the thickness of the film expressed by relative values not absolute values. The line CL in the graph of FIG. 13 indicates the central position of the substrate which corresponds to the center of each of the opposed targets T and T'. At this stage, the erosion distribution of the respective targets T and T' were different with respect to types A through D. The erosion distribution in type A was uniform as illustrated in FIG. 8. However, with types B through D, the central portion of the surface of each of the targets was deeply eroded, and the peripheral portion was shallowly eroded. That is, the eroded area distributions with types of B through D were approximately equal to or slightly improved over the conventional case.

From the result of Example 3, it was clarified that the provision of the reflecting electrode 110 according to the present invention brings about a remarkable improvement in the sputtering characteristic, over the conventional opposed target type sputtering method and apparatus. Thus, it was confirmed that the sputtering under a low sputtering gas pressure and a low voltage, which was considered impossible, can be made possible. As a result, as stated later, a production of a high quality thin film having a small internal strain and containing a small argon gas mixture can be realized.

In addition, it was clarified that, according to the combination of the provision of the reflecting electrode and the generation of the auxiliary magnetic field, not only is the eroded area of the surface of the target extensively increased but also an ideal uniform erosion over the entire surface of the target is realized. Moreover, even when a target having a large width is employed, the thickness of the thin film obtained by that wide target is uniform. Therefore, it will be understood that great progress in the production of a thin film by sputtering can be brought about by the present invention.

EXAMPLE 4

In Example 4, the experimental film production was carried out by the employment of the target portion 100 (100') as shown in FIG. 5, and the mechanical dimensions of the targets T and T' and the arrangement of the reflecting electrodes 110 are the same as in Example 1. The material of the targets was Ni 80 weight %, Fe 15 weight %, Mo 5 weight % alloy, and a soft magnetic film or a low coercive-force film of the known two-layer type perpendicular magnetic recording medium was continuously produced on a long substrate made of a film of polyethylene terephthalate (PET). Also, the reflecting plate 111 of the reflecting electrode 110 was a nickel (Ni) plate.

Figure 14:
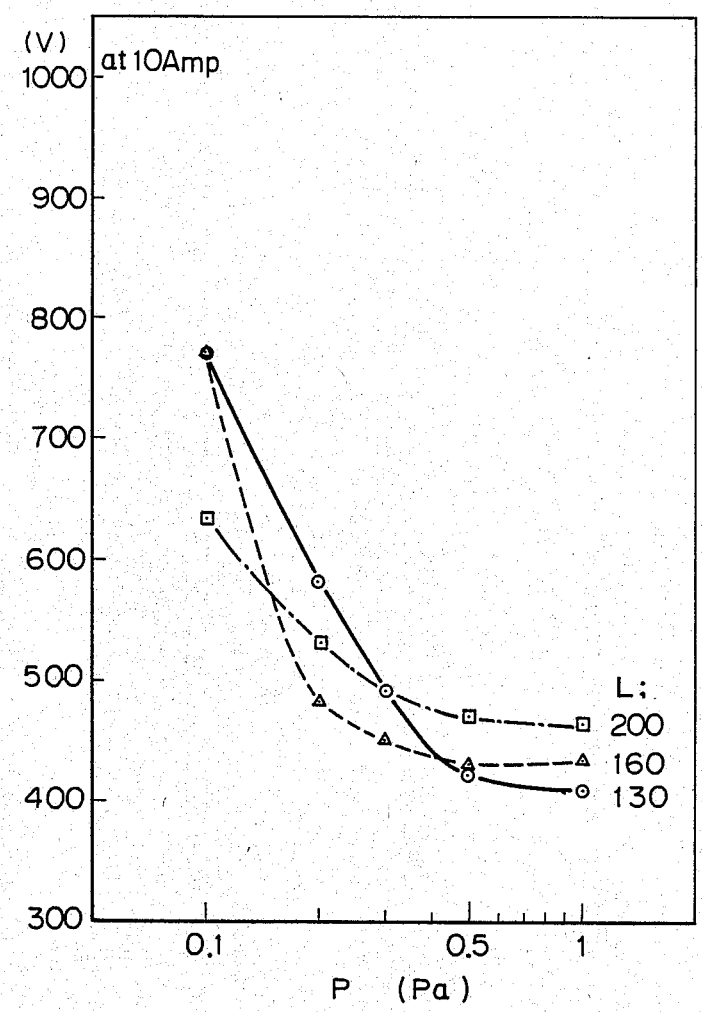
FIG. 14 is a graph indicating the electric discharge characteristic, with respect to example 4.

The distance L between the opposed targets T and T' was set to three different dimensions, i.e., 130 mm, 160 mm, and 200 mm, and with respect to these three distances of the opposed targets, a change in the sputtering current I 10 amperes was examined sputtering current I of 10 amperes by changing the pressure of the sputtering gas, i.e., argon gas pressure, from 0.1 Pa to 1.0 Pa. The result of the examination is illustrated in FIG. 14.

The other low coercive-force films such as those disclosed in U.S. Pat. Nos. 4,576,700 to Kadokura et al and 4,210,946 to Iwasaki et al may obviously be produced by the method and apparatus of the present invention, and will exhibit a like result.

Figure 15:
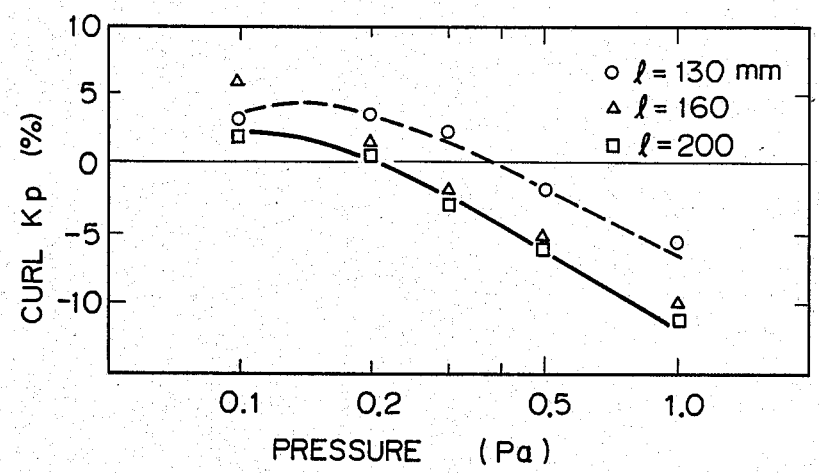
FIG. 15 is a graph indicating the relationship between the curl Kp and the gas pressure Pa, with respect to example 4.
Figure 16:
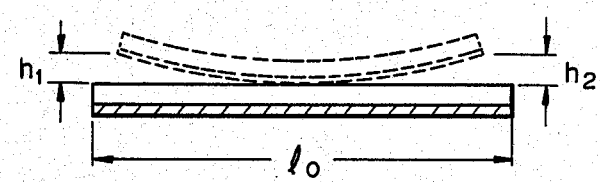
FIG. 16 is a schematic view explaining the definition of the curl Kp.

The graph of FIG. 15 indicates the value of a curl (Kp) in the case where a permalloy (Ni 85 weight % Fe 15 weight % Mo 5 weight %) layer of 0.3 micrometer was produced on one surface of a PET film of 50 micrometers, running on the support roll 42 (FIG. 1) having a surface temperature of 60 through 70 degrees centigrade. At this stage, the curl Kp was defined by the equation below.

$$Kp = \{(h_1 + h_2)/2 \; l_0\} \times 100 \; (\%),$$

wherein as illustrated in FIG. 16, the symbol $l_0$ indicates the diameter of a round plate-like specimen ($l_0$=30 mm in the used specimen) without curl and the symbols $h_1$ and $h_2$ indicate the maximum deviations of the round specimen with curl from the specimen without curl.

It was confirmed that, in accordance with the present invention, the curl Kp of the permalloy layer or film deposited on one side of the PET film can be made approximately zero by controlling the pressure of the sputtering gas. That is, it was clarified that, in accordance with the present invention, a thin film with no curl may be produced.

Also, when the magnetic property was examined, it was found that the magnetic coercive force Hc was equal to or less than 2 Oe at a range of sputtering gas pressure of from 0.1 through 0.5 Pa. Thus, an excellent soft magnetic property was exhibited. That is, when the initial permeability $\mu i$ was examined with respect to the film production under the condition that the distance L between the targets was 200 mm, the initial permeability $\mu i$ was 300 through 450 and the magnetic anisotropy was small at a position in which the curl Kp is approximately zero.

In the prior art, when the two layer medium of a Co-Cr magnetic perpendicular film and a permalloy film is produced, the magnetic anisotropy must be increased under the condition wherein the magnetic coercive force of the permalloy is equal to or less than 3 Oe. Thus, when such a two layer medium is employed as a magnetic flexible disc, the occurrence of the signal level in the peripheral direction of the disc, i.e., modulation, cannot be avoided.

It should be noted that when the prior art opposed target type sputtering apparatus without a reflecting electrode was employed for experimentally producing a film, it was confirmed that the sputtering voltage (V) was increased to 800 volts in response to a lowering of the sputtering gas pressure to less than 0.5 Pa, and that it was impossible to make the curl Kp zero.

On the other hand, it was known that, with respect to a perpendicular magnetic recording medium having a two layer perpendicular magnetic film, when a main pole exciting type head is used for recording information onto the perpendicular magnetic recording medium, the signal level is substantially constant if the initial permeability $\mu i$ is equal to or more than 200. Therefore, it was confirmed that, when the perpendicular magnetic recording medium to be used for a perpendicular magnetic recording flexible disc is produced by the employment of the opposed target type sputtering apparatus according to the present invention, the problem of variation of the signal level will be overcome.

Further, in Example 4, when the distance between the opposed targets T and T' was set at 200 mm, the rate of deposition on the substrate by sputtering was increased by 30% compared with the distance of 120 mm with the application of the same sputtering power.

EXAMPLE 5

In Example 5, the opposed target type sputtering apparatus having the same target portion 100 (100') as in Example 4 was employed to experimentally produce a film on the substrate, except that the targets T and T' were Co 80 weight %, Cr 20 weight % alloy targets and that the reflecting plate 111 of the reflecting electrode 110 was a cobalt plate. The substrate employed were polyethylene-2,6-napthalate films 6.5 microns thick and 12 microns thick, respectively, which were conveyed over a support roll 42 having a surface temperature of 130° C. On the above-mentioned substrate, a 0.1 micron thick Co-Cr film was deposited so that the perpendicular magnetic recording medium was obtained.

The crystal of the Co-Cr layer or film on both the 6.5 microns thick and 12 microns thick polyester film was hcp and had a C axis orientation, and the C axis dispersion $\Delta\theta_{50}$ was 5°0. Further, the perpendicular coercive force $H_{c1}$ was 800 Oe, and the in-plane coercive force $H_{c2}$ was 150 Oe. Thus, it was confirmed that the magnetic property was suitable for a perpendicular magnetic recording.

On the other hand, in the production of the film by the prior art opposed target type sputtering apparatus not provided with a reflecting electrode, the perpendicular coercive force was 550 Oe under the condition of a 130° C. surface tempeature of the support roll 42. Therefore, it was confirmed that, in accordance with the present invention, the Co-Cr system magnetic film suitable for the high density magnetic recording can be produced on the substrate. That is, it was understood that, in accordance with the present invention, the high density recording tape necessary for a VTR of the high-definition television as well as the curlless perpendicular magnetic recording medium having an excellent perpendicular magnetic anisotropy property, can be produced.

EXAMPLE 6

In Example 6, the target portion 100 (100') having the construction as illustrated in FIG. 5 and the same mechanical dimensions as that of Example 1 was employed for producing a film on the substrate. The employed target T (T') comprised three different targets, i.e., the Ni 80 weight % Cr 20 weight % target as stated in the case of Example 4, the Co 80 weight % Cr 20 weight % target as stated in Example 5, and the cobalt target.

The film was produced on both faces A and B of the 50 microns thick PET film under the following conditions for the sputtering operation.

(1) Re: the Ni 80 weight %, Fe 15 weight %, Mo 5 weight % (permalloy) target

Vacuum level within the vessel 10 (FIG. 1): $3 \times 10^{-4}$ Pa;

Ar gas pressure applied to the surface of the PET film: 0.2 Pa;

The 0.48 microns thick film was initially deposited on the face A of the PET film. Subsequently, the PET film was turned over, and the thin film deposition was again carried out under the above-mentioned conditions. Thus, on both faces A and B, a thin Ni 80 weight %, Fe 15 weight %, Mo 5 weight % film was produced.

(2) Re: Co 80 weight % Cr 20 weight % target
Exhausted level of the vacuum vessel 10 (FIG. 1): $3\times 10^{-4}$ Pa;
Argon gas pressure applied to the faces A and B: 0.1 Pa;
Surface temperature of support roll 42: 120° C.;
Thus, the permalloy layer and the 0.15 micron Co-Cr layer deposited on the permalloy layer were produced by sputtering.

(3) Re: Co target
Sputtering gas consisting of a mixture of 70 volume % Ar gas and 30 volume % $O_2$ gas: 0.5 Pa;
Thus, on both surfaces A and B of the PET film, a 0.02 micron CoOx film was produced.

With the above-mentioned thin film deposited on both faces of the PET film, the curl Kp was examined by the use of a round sample specimen of 3.5 inches in diameter, punched out of the produced mediums of (1), (2), and (3) above. As a result, the curl Kp was found to be less than 1%. The magnetic coercive force of the permalloy film was 3 through 4 Oe, the perpendicular magnetic coercive force of the Co-Cr film was 655 through 670 Oe, and the face coercive force was 440 through 455 Oe.

With respect to the above-mentioned punched samples, the recording and retrieving characteristics were examined by the employment of the separately arranged head system (11th meeting of the Japan Society for Applied Magnetism 1987, 1 PA-4). The head employed was a single pole type perpendicular head (The report of the All-Japan Meeting of the Institute of Electronics and Communication Engineers, 1-209 (1986)).

When the track width of the main pole Tw was 100 micrometers, and when the film thickness of the main pole was 0.3 micrometers, the normalized regenerated voltage at 2 kfci (kilo flux change per inch) was 24.2 nVo-p/T·μ·m/s, where nVo-p indicates the normalized zero to peak voltage, T indicates the number of turns of the main pole coil, and μ indicates a unit dimension of the track width, and the C (carrier)/N (noise) at 70 kfci was 54.7 dB. The recording density $D_{50}$ at which the signal level becomes 50% was 80 kfci.

The magnetic recording characteristic of the above-mentioned magnetic recording medium was far superior to that of the magnetic recording medium produced by the prior art opposed target type sputtering apparatus.

From the foregoing description of the embodiments and Examples of the present invention, it will be understood that, in accordance with the present invention, the target employed for the opposed type sputtering apparatus is subjected to an approximately even erosion over the entire surface thereof. Further, the cooling effect of the target can be enhanced, and the electric sputtering voltage can be lowered. Therefore, the production rate of the thin film deposit on a substrate can be very high, and a thin film production can be achieved over a wide range of the sputtering gas pressure. As a result, even special thin films, such as Co-Cr film or Ni-Fe-Mo film, which need careful control of the crystal texture, can be successfully produced.

It should be understood that various modifications and variations will readily occur to persons skilled in the art without departing from the scope and spirit of the present invention.

We claim:

1. An opposed target type sputtering apparatus for producing a film on a substrate, comprising:

means for defining a closed vacuum chamber supplied therein with sputtering gas;
a pair of targets arranged so as to be spaced apart from and opposed to one another within said closed vacuum chamber, each of said targets having a sputtering surface thereof;
means for stationarily supporting said pair of targets so as to define a predetermined space between said pair of opposed targets;
means for applying an electric power to said pair of targets to cause sputtering from the surfaces of said targets;
magnetic field generating means arranged around each of said pair of targets for generating a perpendicular magnetic field extending in a direction perpendicular to said sputtering surfaces of said opposed targets and coincident with an opposing direction of said pair of targets;
means for holding said substrate at a position beside said space extending between said pair of opposed targets;
reflecting electrode means arranged at at least one of first and second positions for reflecting electrons discharged from said surfaces of said pair of targets during the sputtering, said first position being a position adjacent to and in front of said magnetic field generating means and said second position being a position adjacent to a periphery of each of said pair of opposed targets.

2. An opposed target type sputtering apparatus for producing a film on a substrate according to claim 1, further comprising:
means for generating an auxiliary magnetic field to capture said electrons at a region adjacent to and in front of at least said peripheries of said opposed targets, said auxiliary magnetic field having a magnetic field component in parallel with said surfaces of said opposed targets.

3. An opposed target type sputtering apparatus for producing a film on a substrate according to claim 2, wherein said magnetic field generating means comprise magnetic pole means for generating both said perpendicular magnetic field and said auxiliary magnetic field.

4. An opposed target type sputtering apparatus for producing a film on a substrate according to claim 3, wherein said magnetic pole means of said magnetic field generating means comprise a portion arranged so as to be projected beyond said surface of each said target into said space extending between said opposed targets.

5. An opposed target type sputtering apparatus for producing a film on a substrate according to claim 4, wherein said magnetic pole means of said magnetic field generating means act as said reflecting electrode means.

6. An opposed target type sputtering apparatus for producing a film on a substrate according to claim 1, wherein said magnetic field generating means comprise magnetic core means made of magnetic material and arranged adjacent to said peripheries of said opposed targets, and magnet means arranged behind said magnetic core means with respect to said surfaces of said opposed targets.

7. An opposed target type sputtering apparatus for producing a film on a substrate according to claim 6, wherein said magnetic field generating means further comprise non-magnetic holder means for holding said magnetic core means and said magnet means at positions adjacent to and spaced from said peripheries of said opposed targets.

8. An opposed target type sputtering apparatus for producing a film on a substrate according to claim 6, wherein said magnet means comprise a plurality of permanent magnet pieces combined together and arranged around said peripheries of said opposed targets.

9. An opposed target type sputtering apparatus for producing a film on a substrate according to claim 6, wherein said magnetic core means act as said reflecting electrode means.

10. An opposed target type sputtering apparatus for producing a film on a substrate according to claim 1, wherein said reflecting electrode means comprise an electrode member continuously extending so as to surround each of said pair of opposed targets.

11. An opposed target type sputtering apparatus for producing a film on a substrate according to claim 10, wherein said electrode member of said reflecting electrode means comprises a plate-like member having a predetermined width suitable for covering a gap left between said means for holding said pair of targets and said magnetic field generating means.

12. An opposed target type sputtering apparatus for producing a film on a substrate according to claim 10, wherein said electrode member of said reflecting electrode means is made of the same material as that of said opposed targets.

13. An opposed target type sputtering apparatus for producing a film on a substrate according to claim 1, wherein said reflecting electrode means comprise a fixed electrode member fixedly attached to said means for stationarily supporting said pair of targets, and a removable reflecting plate removably mounted on said fixed electrode member, said removable reflecting plate being positioned in said space and adjacent to said periphery of each of said pair of opposed targets.

14. An opposed target type sputtering apparatus for producing a film on a substrate according to claim 1, wherein said pair of targets are electric cathode means, and wherein electric anode means are arranged so as to surround said space between said pair of opposed targets.

15. An opposed target type sputtering apparatus for producing a film on a substrate according to claim 14, wherein said anode means comprise a tubular member arranged at a position in said space adjacent to said periphery of each of said pair of opposed targets and spaced from said magnetic field generating means, said tubular means having therein a conduit for coolant.

16. An opposed target type sputtering apparatus for producing a film on a substrate according to claim 1, wherein said pair of targets are cathode means, and wherein anode means are arranged so as to surround said magnetic field generating means, said anode means functioning as a sputtering shield means.

17. An opposed target type sputtering apparatus for producing a film on a substrate according to claim 1, wherein said means for stationarily supporting said pair of targets comprise a pair of support members, each of said support members being provided therein with recesses for permitting a coolant to flow for directly cooling said pair of opposed targets.

18. An opposed target type sputtering apparatus for producing a film on a substrate according to claim 1, wherein said means for holding said substrate at a position beside said space extending between said pair of opposed targets comprise a supply roll having thereon a continuous strip of said substrate having a predetermined width thereof, a support roll supporting thereon said substrate supplied from said supply roll in a posture facing said space between said pair of opposed targets and at a right angle to each of said pair of opposed targets, and a winding roll for receiving said substrate sent from said support roll.

19. An opposed target type sputtering apparatus for producing a film on a substrate according to claim 18, wherein said support roll is provided therein with means for adjusting the temperatures of a surface of said support roll.

20. A sputtering method of depositing a thin film on a substrate positioned beside a space extending between a pair of opposed cathode targets arranged in a closed vacuum chamber containing therein sputtering gas, comprising in combination the steps of:
applying electric sputtering power between the pair of opposed cathode targets and an anode electrode;
generating a first magnetic field extending in the direction perpendicular to the surfaces of said pair of opposed cathode targets for confining plasma, and;
refelcting electrons discharged from the surfaces of said pair of opposed cathode targets into said space extending between said pair of opposed targets.

21. A sputtering method of depositing a thin film on a substrate, according to claim 20, further comprising the step of:
generating a second magnetic field circulating through the periphery of each of said opposed targets for capturing electrons discharged from the surfaces of said pair of opposed cathode targets.

22. A sputtering method of depositing a thin film on a substrate, according to claim 20, wherein said reflecting of said electrons discharged from the surfaces of said pair of opposed cathode targets into said space extending between said pair of opposed targets is carried out by reflecting electrodes positioned at at least one of first and second positions, said first position being a position adjacent to said periphery of each of said pair of opposed targets, and said second position being adjacent to said second magnetic field.

23. A sputtering method of depositing a thin film on a substrate, according to claim 20, wherein said pair of opposed targets are made of Co-Cr system alloy material, and wherein said substrate is made of a plastic film, whereby a Co-Cr system alloy film is deposited on said plastic film.

24. A sputtering method of depositing a thin film on a substrate, according to claim 23, wherein said plastic film is a polyethylene-2,6-naphthalate film.

25. A sputtering method of depositing a thin film on a substrate, according to claim 23, wherein a crystal of said Co-C$_r$ system alloy layer is hcp and has a C-axis orientation.

26. A sputtering method of depositing a thin film on a substrate, according to claim 20, wherein said pair of opposed targets are made of a soft magnetic alloy, and wherein said substrate is made of a plastic film, whereby a two-layer perpendicular magnetic recording medium having a soft magnetic layer and a Co-Cr system layer thereon is produced.

27. A sputtering method of depositing a thin film on a substrate, according to claim 26, wherein said Co-Cr system layer on said soft magnetic layer is produced by the employment of a said pair of opposed targets made of a Co-Cr system alloy.

28. A sputtering method of depositing a thin film on a substrate, according to claim 20, wherein said pair of opposed targets are made of a cobalt material, wherein said substrate is made of a polyester film, and wherein said sputtering gas is a mixture of 70 volume % argon and 30 volume % $O_2$, whereby a CoOx film is produced on both faces of said polyester film.

29. A sputtering method of depositing a thin film on a substrate, according to claim 20, wherein said pair of opposed targets are made of a soft magnetic alloy, and wherein said substrate is made of a plastic film, whereby a film of a soft magnetic alloy is produced on both faces of said plastic film.

* * * * *

UNITED STATES PATENT AND TRADEMARK OFFICE
CERTIFICATE OF CORRECTION

PATENT NO. : 4,784,739

DATED : November 15, 1988

INVENTOR(S) : S. Kadokura, et al.

It is certified that error appears in the above-identified patent and that said Letters Patent is hereby corrected as shown below:

Column 2, line 5, change "302b;" to --302b.--.

Column 4, line 25, beginning with "it is possible to", line 26 (the whole line), line 27 (the whole line), and line 28 ending at "sputtered film, and" should be in regular type not bold type.

Column 12, line 43, change "targets T', the targets T and T'," to --targets T and T',--.

Column 13, line 56, between "by" and "of" insert --way--.

Column 16, line 64-66, change "the sputtering current I 10 amperes was examined sputtering current I of 10 amperes by" to --the electric sputtering voltage V against a constant electric sputtering current I of 10 amperes was examined by--.

Column 18, line 14, change "substrate" to --substrates--.

UNITED STATES PATENT AND TRADEMARK OFFICE
CERTIFICATE OF CORRECTION

PATENT NO. : 4,784,739

DATED : November 15, 1988

INVENTOR(S) : S. Kadokura, et al.

It is certified that error appears in the above-identified patent and that said Letters Patent is hereby corrected as shown below:

Column 18, line 24, change "5°0." to --5°.--

Column 18, line 61, change "Ar" to --Argon--.

Column 22, line 22, change "refelcting" to --reflecting--.

Column 22, line 22, between "reflecting" and "electrons" insert --said--.

Column 22, line 53, change "Co-$C_r$" to --Co-Cr--.

Signed and Sealed this

Second Day of May, 1989

Attest:

DONALD J. QUIGG

Attesting Officer

Commissioner of Patents and Trademarks

UNITED STATES PATENT AND TRADEMARK OFFICE
CERTIFICATE OF CORRECTION

PATENT NO. : 4,784,739

DATED : November 15, 1988

INVENTOR(S) : S. Kadokura, et al.

It is certified that error appears in the above-identified patent and that said Letters Patent is hereby corrected as shown below:

On the title page,

The correct name of one of the inventors is

-- Akio Kusuhara --.

Signed and Sealed this

Twentieth Day of June, 1989

Attest:

DONALD J. QUIGG

Attesting Officer

Commissioner of Patents and Trademarks